(12) United States Patent
Hong

(10) Patent No.: US 12,726,188 B2
(45) Date of Patent: Sep. 1, 2026

(54) SIGNAL DRIVING CIRCUIT AND SEMICONDUCTOR DEVICE USING THE SAME

(71) Applicant: SK hynix Inc., Icheon-si (KR)

(72) Inventor: Yun Suk Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 120 days.

(21) Appl. No.: 18/921,423

(22) Filed: Oct. 21, 2024

(65) Prior Publication Data

US 2026/0025129 A1 Jan. 22, 2026

(30) Foreign Application Priority Data

Jul. 19, 2024 (KR) ........................ 10-2024-0095768

(51) Int. Cl.
*H03K 3/017* (2006.01)
*H03K 5/135* (2006.01)

(52) U.S. Cl.
CPC ............ *H03K 5/135* (2013.01); *H03K 3/017* (2013.01)

(58) Field of Classification Search
CPC ............................... H03K 3/017; H03K 5/135
USPC ................................ 327/108, 109, 172, 331
See application file for complete search history.

(56) References Cited

U.S. PATENT DOCUMENTS 6,337,581 B1 1/2002 Kanetani et al.
6,922,443 B1 * 7/2005 Kusumoto .......... H04L 25/0292 375/220
2019/0253041 A1 * 8/2019 Kim ....................... G11C 7/222

* cited by examiner

*Primary Examiner* — William Hernandez
(74) *Attorney, Agent, or Firm* — WILLIAM PARK AND ASSOCIATES LTD.

(57) ABSTRACT

A signal driving circuit includes a first driver, a control signal generation circuit, and a second driver. The first driver is configured to generate a first transmission signal based on an input signal and a clock signal. The control signal generation circuit is configured to generate a delay clock signal by delaying the clock signal and to generate a first control clock signal and a second control clock signal with different pulse widths than the pulse width of the delay clock signal. The second driver is configured to generate a second transmission signal, based on the first transmission signal and the first and second control clock signals.

23 Claims, 7 Drawing Sheets

FIG. 1

200
210
211
211-1
211-2
211-3
211-4
212
212-1
212-2
212-3
IN
CLKB
PU
PD
VH
VL
OUT1
TL1
220
CONTROL SIGNAL GENERATION CIRCUIT
CLKB
DCLK1
DCLK1B
DCLK2
DCLK2B
230
231
241
241-1
241-2
241-3
241-4
242
242-1
242-2
242-3
242-4
DCLK1B
DCLK1
PUC
PDC
251
251-1
252
252-1
DCLK2
DCLK2B
TN1
TN2
261
262
233
233-1
233-2
233-3
OUT2
TL2

OUT1
CLKDB
(SS skew)
t1
DCLK1
FLOAT
DCLK2

Figure 6:
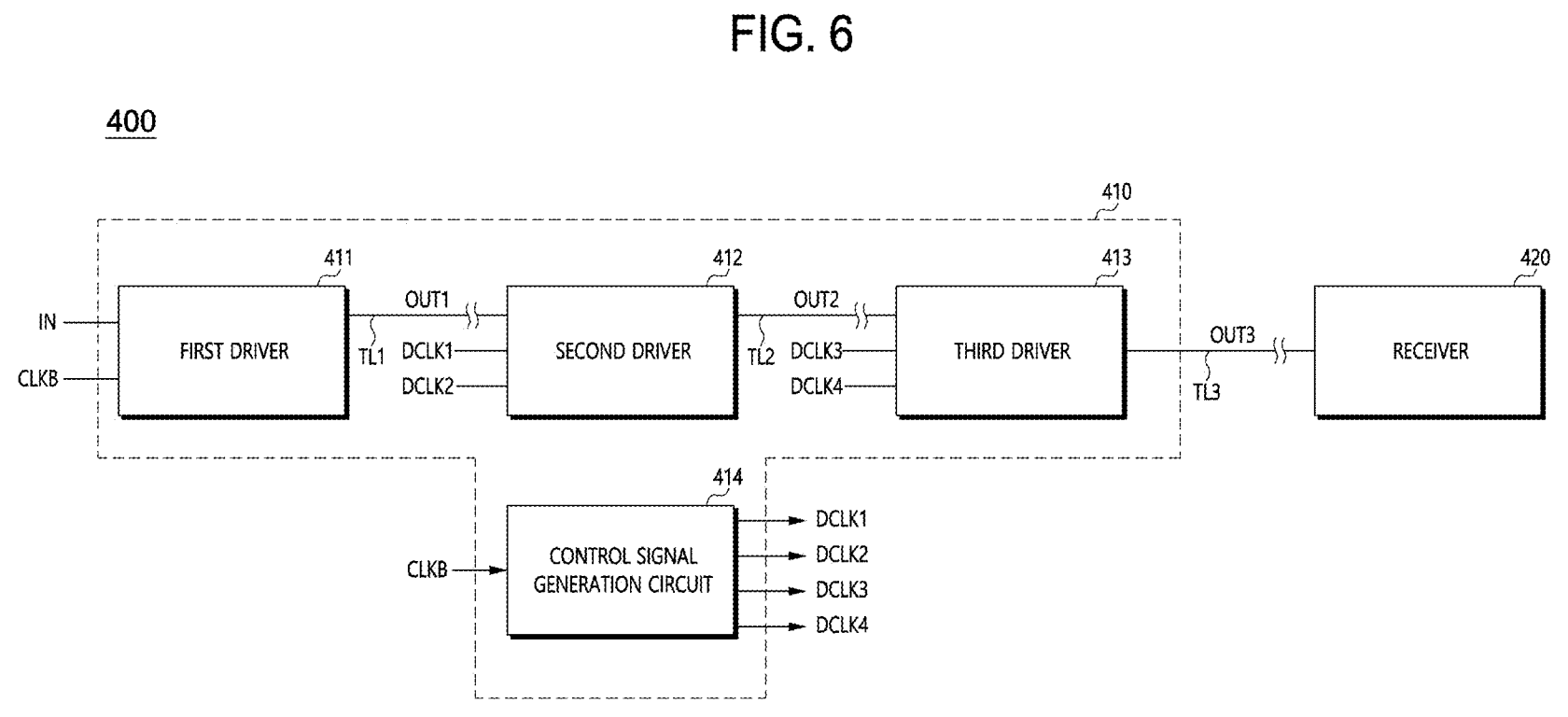

411 FIRST DRIVER

412 SECOND DRIVER

413 THIRD DRIVER

414 CONTROL SIGNAL GENERATION CIRCUIT

420 RECEIVER

IN

CLKB

OUT1

TL1

DCLK1

DCLK2

OUT2

TL2

DCLK3

DCLK4

OUT3

TL3

CLKB

DCLK1

DCLK2

DCLK3

DCLK4

SIGNAL DRIVING CIRCUIT AND SEMICONDUCTOR DEVICE USING THE SAME

CROSS-REFERENCES TO RELATED APPLICATION

The present application claims priority under 35 U.S.C. § 119(a) to Korean Patent Application No. 10-2024-0095768, filed in the Korean Intellectual Property Office on Jul. 19, 2024, the entire contents of which application is incorporated herein by reference.

BACKGROUND

1. Technical Field

Various embodiments relate to an integrated circuit technology, including but not limited to a signal driving circuit and a semiconductor device using the same.

2. Related Art

A semiconductor device may include a plurality of internal circuits. The plurality of internal circuits transmit and receive signals to and from each other. To transmit a signal from a first internal circuit to a second internal circuit, a transmitter or transmission circuit and/or a driver or driver circuit are used. The first internal circuit is electrically coupled to the second internal circuit through a signal transmission line. The transmitter and/or the driver drive signals on the signal transmission line at a high logic level or a low logic level based on the logic level of a signal transmitted from the first internal circuit to the second internal circuit.

A common transmitter and/or driver outputs an output signal on a signal transmission line based on the logic level of an input signal during an interval in which a clock signal is enabled.

SUMMARY

In an embodiment, a signal driving circuit may include a first driver, a control signal generation circuit, and a second driver. The first driver may be configured to generate a first transmission signal based on a clock signal and an input signal. The control signal generation circuit may be configured to generate a delay clock signal by delaying the clock signal, to generate a first control clock signal including a different pulse width than a pulse width of the delay clock signal, and to generate a second control clock signal having a pulse width that surrounds a pulse width of the first control clock signal. The second driver may be configured to float a first node and a second node based on the second control clock signal, to output a first driving control signal to the first node and a second driving control signal to the second node based on the first control clock signal and the first transmission signal, and to generate a second transmission signal based on a voltage level of the first node and a voltage level of the second node.

In an embodiment, a signal driving circuit may include a first driver, a control signal generation circuit, and a second driver. The first driver may be configured to generate a first transmission signal based on a clock signal and an input signal. The control signal generation circuit may be configured to generate a delay clock signal by delaying the clock signal, to generate a first control clock signal having a narrower pulse width than the delay clock signal when a process variation is a first skew corner and a second skew corner, to generate the first control clock signal having a wider pulse width than the delay clock signal when the process variation is a third skew corner, and to generate a second control clock signal having a pulse width that surrounds the pulse width of the first control clock signal. The second driver may be configured to generate a first driving control signal and a second driving control signal based on the first transmission signal during an interval in which the first control clock signal is enabled, to generate a second transmission signal based on the first driving control signal and the second driving control signal, and maintain voltage levels of the first driving control signal and the second driving control signal during an interval in which the second control clock signal is enabled.

In an embodiment, a method may include generating a first transmission signal based on a clock signal and an input signal; generating a delay clock signal by delaying the clock signal; generating a first control clock signal with a pulse width different than a pulse width of the delay clock signal; generating a second control clock signal having a pulse width beginning before and ending later than a pulse width of the first control clock signal; floating a first node and a second node based on the second control clock signal; outputting a first driving control signal to the first node and a second driving control signal to the second node based on the first control clock signal and the first transmission signal; and generating a second transmission signal based on a voltage level of the first node and a voltage level of the second node.

BRIEF DESCRIPTION OF THE DRAWINGS

FIG. 1 is a diagram illustrating a configuration of a signal driving circuit according to an embodiment.

FIG. 6 is a diagram illustrating a configuration of a semiconductor device according to an embodiment.

DETAILED DESCRIPTION

Figure 2A:
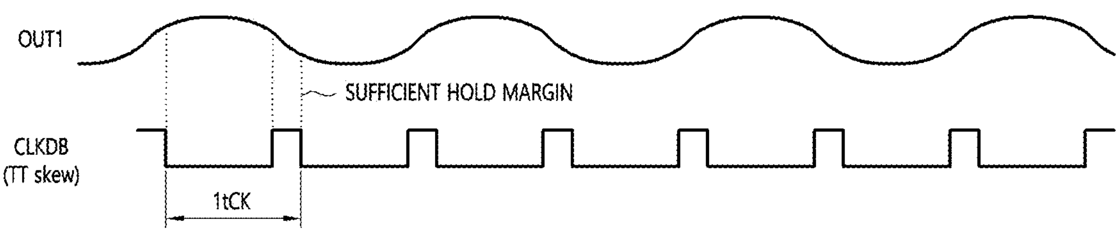
FIG. 2A to FIG. 2C are timing diagrams during operation of a signal driving circuit according to an embodiment.

Embodiments of the present disclosure are described in detail with reference to the accompanying drawings. Specific structural or functional descriptions of embodiments are provided as examples to describe concepts that are disclosed in the present application. Examples or embodiments in accordance with the concepts may be carried out in various forms, and the scope of the present disclosure is not limited to the examples or embodiments described in this specification.

When one element is identified as "connected" or "coupled" to another element, the elements may be connected or coupled directly or through at least one intervening element between the elements. When two elements are identified as "directly connected" or "directly coupled," one element is directly connected or directly coupled to the other element without an intervening element between the two elements.

Figure 1:
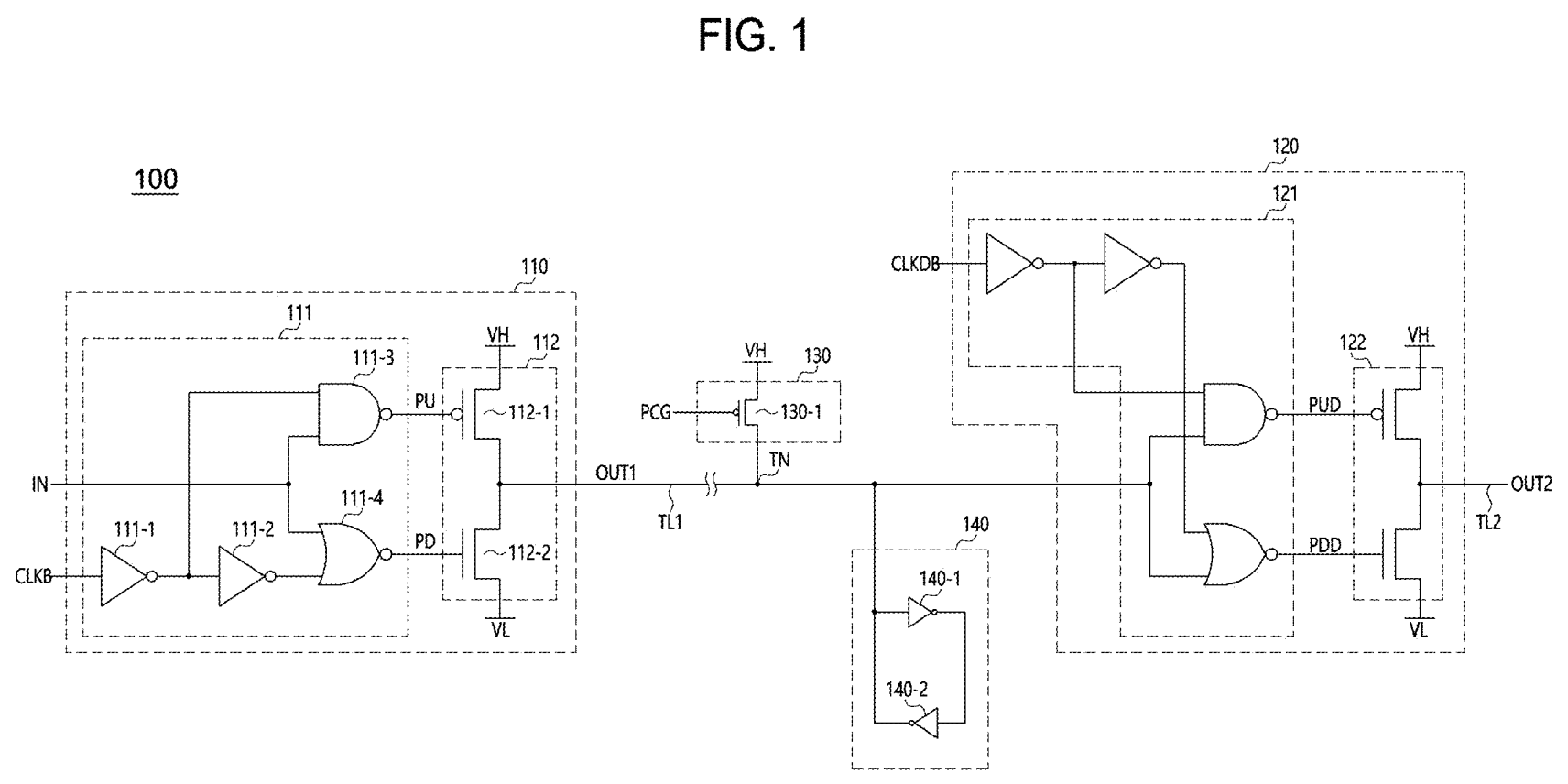

FIG. 1 is a diagram illustrating a configuration of a signal driving circuit 100 according to an embodiment. The signal driving circuit 100 receives an input signal IN and generates a first transmission signal OUT1 and a second transmission signal OUT2. The signal driving circuit 100 receives a clock signal CLKB and generates the transmission signals OUT1 and OUT2 in synchronization with the clock signal CLKB. The clock signal CLKB is a signal that is periodically toggled according to a frequency or time interval, for example, varied between a high logic level and a low logic level at the frequency or time interval. The frequency or period of the clock signal CLKB may be substantially similar to the duration of the input signal IN. The signal driving circuit 100 includes a first driver 110 and a second driver 120. The drivers 110 and 120 operate in synchronization with the clock signal CLKB. The first driver 110 receives the clock signal CLKB. The second driver 120 receives a delay clock signal CLKDB generated by delaying the clock signal CLKB. A first signal transmission line TL1 couples the first driver 110 to the second driver 120. The first driver 110 generates a signal OUT1 that is transmitted on the first signal transmission line TL1. The second driver 120 includes a circuit that repeats signals transmitted on the first signal transmission line TL1. The delay clock signal CLKDB is generated, for example, by delaying the clock signal CLKB by a time period that corresponds to the propagation delay of a signal transmitted from the first driver 110 to the second driver 120 on the first signal transmission line TL1.

The first driver 110 includes a circuit that receives the input signal IN and the clock signal CLKB. The first driver 110 generates the first transmission signal OUT1 based on the input signal IN and the clock signal CLKB. The first driver 110 operates in synchronization with the clock signal CLKB. The first driver 110 outputs the logic level of the first transmission signal OUT1 based on the logic level of the input signal IN while the clock signal CLKB is enabled, for example, at a low logic level. The first driver 110 is electrically coupled to the first signal transmission line TL1 and outputs the first transmission signal OUT1 on the first signal transmission line TL1.

The second driver 120 includes a circuit that receives the first transmission signal OUT1 and the delay clock signal CLKDB. The second driver 120 generates the second transmission signal OUT2 based on the first transmission signal OUT1 and the delay clock signal CLKDB. The second driver 120 operates in synchronization with the delay clock signal CLKDB. The second driver 120 outputs the logic level of the second transmission signal OUT2 after sampling the logic level of the first transmission signal OUT1 while the delay clock signal CLKDB is enabled. The second driver 120 transmits the second transmission signal OUT2 on the second signal transmission line TL2 that may be connected to a component or circuit. For example, the component or circuit may be another driver or may be a receiver.

The signal driving circuit 100 includes a precharge circuit 130 in an embodiment. The precharge circuit 130 is electrically coupled to the first signal transmission line TL1 through a node TN and is disposed between the first driver 110 and the second driver 120. The precharge circuit 130 may precharge the first signal transmission line TL1 based on a precharge signal PCG. For example, the precharge circuit 130 receives a first voltage VH and precharges the node TN and the first signal transmission line TL1 to the voltage level of the first voltage VH when the precharge signal PCG is enabled, for example, at a low logic level. The precharge circuit 130 does not precharge the first signal transmission line TL1 when the precharge signal PCG is disabled, for example, at a high logic level. The precharge signal PCG may be enabled during an interval in which the input signal IN is not input to the signal driving circuit 100. The precharge signal PCG may be disabled during an interval in which the input signal IN is input to the signal driving circuit 100.

The signal driving circuit 100 includes a latch 140 in an embodiment. The latch 140 is electrically coupled to the first signal transmission line TL1 through the node TN. The latch 140 maintains the voltage level of the node TN. The current driving force of the latch 140 is smaller than the current driving force of the drivers 110 and 120. For example, when the first driver 110 applies a signal to the node TN based on the input signal IN, a latched voltage of the latch 140 may oppose the output voltage of first driver 110, but cannot prevent a change in the logic level of the node TN caused by the first driver 110. The current driving force of the latch 140 may be substantially the same as the current driving force of the precharge circuit 130 or may be smaller than the current driving force of the precharge circuit 130. The drivers 110 and 120 may be implemented with transistors having a greater size than transistors of the latch 140 and the precharge circuit 130.

The first driver 110 includes a first pre-driving circuit 111 and a first main-driving circuit 112. The first pre-driving circuit 111 receives the input signal IN and the clock signal CLKB and generates a pull-up signal PU and a pull-down signal PD based on the input signal IN and the clock signal CLKB. When the clock signal CLKB is enabled at a low logic level in this example, the first pre-driving circuit 111 enables one of the pull-up signal PU and the pull-down signal PD based on the logic level of the input signal IN. When the clock signal CLKB is enabled and the input signal IN is at a high logic level, the first pre-driving circuit 111 enables the pull-up signal PU at a high logic level and disables the pull-down signal PD at a low logic level. When the clock signal CLKB is enabled and the input signal IN is at a low logic level, the first pre-driving circuit 111 enables the pull-down signal PD at a high logic level and disables the pull-up signal PU at a low logic level. When the clock signal CLKB is disabled at a high logic level, the first pre-driving circuit 111 disables both the pull-up signal PU and the pull-down signal PD at a low logic level.

The first main-driving circuit 112 receives the pull-up signal PU and the pull-down signal PD. The first main-driving circuit 112 generates the first transmission signal OUT1 based on the pull-up signal PU and the pull-down signal PD and outputs the first transmission signal OUT1 on the first signal transmission line TL1. The first main-driving circuit 112 receives the first voltage VH and a second voltage VL. The second voltage VL is at a lower voltage level than the voltage level of the first voltage VH. The first voltage VH is at a voltage level sufficiently high to be determined to be a high logic level. The second voltage VL is at a voltage level sufficiently low to be determined to be a low logic level. Based on the pull-up signal PU, the first main-driving circuit 112 may generate the first transmission signal OUT1 at a high logic level by applying a current to pull-up the voltage level at the node TN of the first signal transmission line TL1 to the voltage level of the first voltage VH. Based on the pull-down signal PD, the first main-driving circuit 112 may generate the first transmission signal OUT1 at a low logic level by applying a current to pull-down the voltage level at the node TN of the first signal transmission line TL1 to the voltage level of the second voltage VL.

The first pre-driving circuit 111 includes a first inverter 111-1, a second inverter 111-2, a NAND gate 111-3, and a NOR gate 111-4. The first inverter 111-1 receives the clock signal CLKB and inverts the clock signal CLKB. The second inverter 111-2 receives the output signal of the first inverter 111-1 and inverts the output signal of the first inverter 111-1. The NAND gate 111-3 receives the input signal IN and the output signal of the first inverter 111-1 and generates the pull-up signal PU by applying NAND logic to the input signal IN and the output signal of the first inverter 111-1. The NOR gate 111-4 receives the input signal IN and the output signal of the second inverter 111-2 and generates the pull-down signal PD by applying NOR logic to the input signal IN and the output signal of the second inverter 111-2.

The first main-driving circuit 112 includes a first transistor 112-1 and a second transistor 112-2. The first transistor 112-1 is a P channel MOS transistor in this example. The second transistor 112-2 is an N channel MOS transistor in this example. The gate of the first transistor 112-1 receives the pull-up signal PU. The source of the first transistor 112-1 receives the first voltage VH. The first transistor 112-1 includes a drain electrically coupled to the node TN of the first signal transmission line TL1. The first transmission signal OUT1 is output from the drain of the first transistor 112-1 when the pull-up signal PU is enabled. The gate of the second transistor 112-2 receives the pull-down signal PD. The source of the second transistor 112-2 receives the second voltage VL. The second transistor 112-2 includes a drain electrically coupled to the node TN of the first signal transmission line TL1. The first transmission signal OUT1 is output from the drain of the second transistor 112-2 when the pull-down signal PD is enabled.

The second driver 120 includes a second pre-driving circuit 121 and a second main-driving circuit 122. The second pre-driving circuit 121 receives the first transmission signal OUT1 and the delay clock signal CLKDB and generates a pull-up signal PUD and a pull-down signal PDD based on the first transmission signal OUT1 and the delay clock signal CLKDB. The second main-driving circuit 122 receives the pull-up signal PUD and the pull-down signal PDD, generates the second transmission signal OUT2 based on the pull-up signal PUD and the pull-down signal PDD and drives the second transmission signal OUT2 on the second signal transmission line TL2. The second pre-driving circuit 121 may have a substantially similar configuration as the first pre-driving circuit 111 and may perform substantially similar functions as the first pre-driving circuit 111, except that the input signals and output signals are different. The second main-driving circuit 122 may have a substantially similar configuration as and perform substantially similar functions as the first main-driving circuit 112, except that the input signals and the output signals are different.

The precharge circuit 130 includes a third transistor 130-1. The third transistor 130-1 is a P channel MOS transistor in this example. The gate of the third transistor 130-1 receives the precharge signal PCG. The source of the third transistor 130-1 receives the first voltage VH. The third transistor 130-1 includes a drain electrically coupled to the node TN of the first signal transmission line TL1. The latch 140 includes a third inverter 140-1 and a fourth inverter 140-2. The third inverter 140-1 includes an input stage electrically coupled to the node TN. The fourth inverter 140-2 includes an input stage electrically coupled to the output stage of the third inverter 140-1. The output stage of the fourth inverter 140-2 is electrically coupled to the input stage of the third inverter 140-1 and the node TN.

Figure 2B:
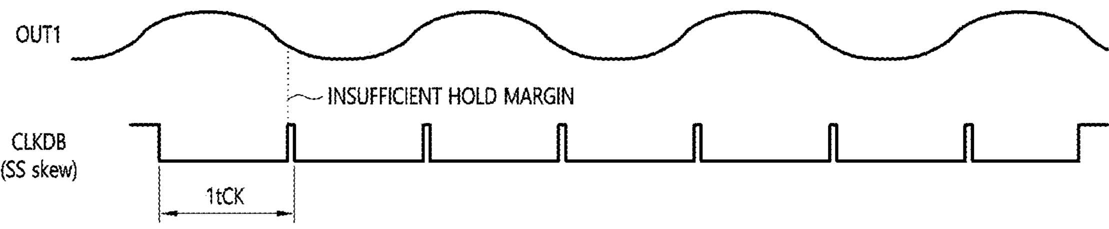
Figure 2C:
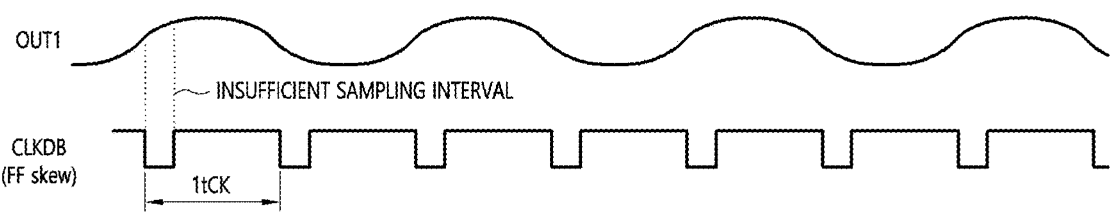

FIG. 2A to FIG. 2C are timing diagrams during operation of the signal driving circuit 100 according to an embodiment. The first driver 110 generates the first transmission signal OUT1 from the input signal IN while the clock signal CLKB is enabled. The CLKB signal has a period of 1tCK in this example. The input signal IN and the first transmission signal OUT1 may each be a pseudo-random binary sequence (PRBS) signal, although the first transmission signal alternates between a high logic level and a low logic level in the examples of FIG. 2A, FIG. 2B, and FIG. 2C. FIG. 2A is a timing diagram illustrating operation of the signal driving circuit 100 when process skew of transistors is Typical/Typical or TT skew. Process skew of a transistor is referred to as one of Typical, Fast, and Slow. Typical includes when operation speed of a transistor is average operating speed of a transistor. Fast includes when operation speed of a transistor is faster than the average operating speed of a transistor. Slow includes when operation speed of a transistor is slower than the average operating speed of a transistor. Typical/Typical includes when operation speed of each of the N channel MOS transistor and the P channel MOS transistor is average operating speed of the transistors. A skew corner that is more likely to be problematic when process variation is Slow/Slow or Fast/Fast. For example, when both the operation speeds of the P channel MOS transistor and the N channel MOS transistor are fast or slow, a malfunction of a logic circuit may occur.

The higher the operating speed of semiconductor devices, the more difficult is the task of setting the enable interval and/or pulse width of the clock signal at a predetermined width to achieve practical setup and hold margins to accurately or reliably generate the output signal from the input signal. When the clock signal does not have an adequate pulse width, the swing width or range of values of the output signal may not be sufficient or the output signal corresponding to the input signal may not be generated due to problems such as process, voltage, temperature (PVT) variance and large load on the signal transmission line.

Referring to FIG. 2A, when process skew of transistors is TT skew, the clock signal CLKB and the delay clock signal CLKDB each have a pulse width and/or an enable interval that is sufficiently wide for reliable operation of the semiconductor device. Pulse width for non-inverted signals, such as the clock signal CLK and the delay clock signal CLKD, includes a time interval while the non-inverted signal is at a high logic level. Pulse width for inverted signals, such as the clock signal CLKB and the delay clock signal CLKDB, includes a time interval while the inverted signal is at a low logic level. During a sufficiently wide enable interval of the delay clock signal CLKDB, the second driver 120 accurately or reliably generates the second transmission signal OUT2 by sampling the first transmission signal OUT1. A hold time includes a time period over which a data signal is continually stable after a clock edge for sampling, and a hold margin is the difference between hold time and time of data arrival. After the delay clock signal CLKDB is disabled, a sufficient hold margin is maintained until the delay clock signal CLKDB is enabled, such as shown in FIG. 2A. When the hold margin is sufficient, the second driver 120 generates the second transmission signal OUT2 at a logic level that corresponds to the logic levels of the input signal IN and the first transmission signal OUT1.

FIG. 2B is a timing diagram illustrating operation of the signal driving circuit 100 when process skew of transistors is Slow/Slow or SS skew. During SS skew, the pulse width of the clock signal CLKB and the delay clock signal CLKDB is larger than the pulse width of the clock signal CLKB when process skew is TT skew. Thus, the pulse width and/or enable interval of the delay clock signal CLKDB is relatively large and the disable interval of the delay clock signal CLKDB is relatively small. When the enable interval of the delay clock signal CLKDB is increased, the sampling interval of the second driver 120 is maintained for a long time, and as a result, the logic level of a current input signal and the logic level of a next or subsequent input signal may be sampled at close points in time, and the hold margin may be insufficient, for example, when the delay clock signal CLKDB has a very short disable period. As a result, the logic level of the second transmission signal OUT2 may be different from the logic level of the input signal IN and the logic level of the first transmission signal OUT1.

FIG. 2C is a timing diagram illustrating operation of the signal driving circuit 120 when process skew of transistors is Fast/Fast or FF skew). During FF skew, the pulse width of the clock signal CLKB and the delay clock signal CLKDB is narrower than the pulse width of the clock signal CLKB when process skew is TT skew. Thus, the pulse width and/or enable interval of the delay clock signal CLKDB is relatively small, and the disable interval of the delay clock signal CLKDB is relatively large. When the enable interval of the delay clock signal CLKDB is decreased, the sampling interval of the second driver 120 may be insufficient, and the second driver 120 might not generate the second transmission signal OUT2 at a logic level that corresponds to the logic level of the first transmission signal OUT1.

Figure 3:
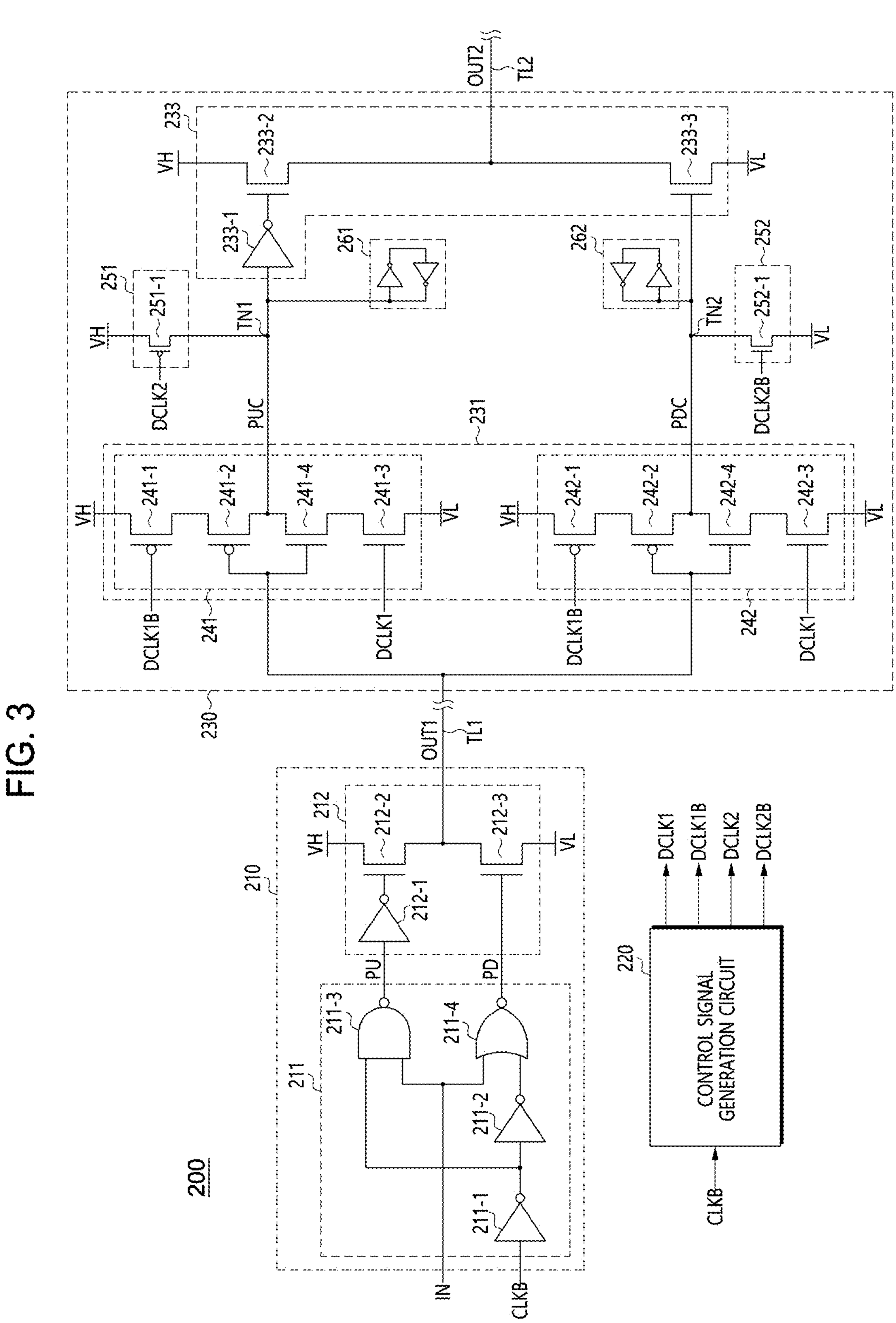
FIG. 3 is a diagram illustrating a configuration of a signal driving circuit according to an embodiment.

FIG. 3 is a diagram illustrating a configuration of a signal driving circuit 200 according to an embodiment. Referring to FIG. 3, the signal driving circuit 200 includes a first driver 210, a control signal generation circuit 220, and a second driver 230. The first driver 210 receives an input signal IN and a clock signal CLKB and generates a first transmission signal OUT1 based on the input signal IN and the clock signal CLKB. The first driver 210 operates in synchronization with the clock signal CLKB. The first driver 210 outputs the logic level of the first transmission signal OUT1 based on the logic level of the input signal IN while the clock signal CLKB is enabled. The first driver 210 is electrically coupled to a first signal transmission line TL1 and outputs the first transmission signal OUT1 on the first signal transmission line TL1. The first driver 210 may reduce power consumption utilized to generate the first transmission signal OUT1 from the input signal IN and facilitates propagation of a high frequency signal by reducing the swing width or range of values of the first transmission signal OUT1.

The control signal generation circuit 220 receives the clock signal CLKB. The control signal generation circuit 220 generates, based on the clock signal CLKB, a delay clock signal CLKDB in FIG. 4, a first control clock signal DCLK1, and a second control clock signal DCLK2. The control signal generation circuit 220 generates the delay clock signal CLKDB by delaying the clock signal CLKB by the propagation delay time period of the first signal transmission line TL1. The control signal generation circuit 220 generates the first control clock signal DCLK1 and the second control clock signal DCLK2 based on the delay clock signal CLKDB. The control signal generation circuit 220 generates the first control clock signal DCLK1 having a different pulse width than the delay clock signal CLKDB. The control signal generation circuit 220 may determine the pulse width of the first control clock signal DCLK1 based on process variation and/or the pulse width of the delay clock signal CLKDB. The control signal generation circuit 220 generates the first control clock signal DCLK1 with a narrower pulse width than the delay clock signal CLKDB when the process variation is a first skew corner or a second skew corner. The control signal generation circuit 220 generates the first control clock signal DCLK1 with a wider pulse width than the pulse width of the delay clock signal CLKDB when the process variation is a third skew corner. The first skew corner may be TT skew. The second skew corner may be SS skew. The third skew corner may be FF skew. For example, as the process variation approaches FF skew, the control signal generation circuit 220 generates the first control clock signal DCLK1 with a pulse width wider than the pulse width of the delay clock signal CLKDB by generating the first control clock signal DCLK1 with a wider pulse width compared to the pulse width of the delay clock signal CLKDB. As the process variation approaches SS skew, the control signal generation circuit 220 generates the first control clock signal DCLK1 with a narrower pulse width than the pulse width of the delay clock signal CLKDB by generating the first control clock signal DCLK1 with a narrower pulse width compared to the pulse width of the delay clock signal CLKDB. For example, when the pulse width of the delay clock signal CLKDB is equal to or larger than a reference pulse width, the control signal generation circuit 220 generates the first control clock signal DCLK1 with a narrower pulse width than the delay clock signal CLKDB. When the pulse width of the delay clock signal CLKDB is narrower than the reference pulse width, the control signal generation circuit 220 generates the first control clock signal DCLK1 with a wider pulse width than the delay clock signal CLKDB. The reference pulse width may be predetermined according to an embodiment. For example, when process skew is TT skew, the reference pulse width corresponds to the pulse width of the clock signal CLKB and the delay clock signal CLKDB.

The control signal generation circuit 220 enables the first control clock signal DCLK1 after the delay clock signal CLKDB is enabled. Thus, the control signal generation circuit 220 enables the first control clock signal DCLK1 at a point in time later than a point in time at which the delay clock signal CLKDB is enabled. The control signal generation circuit 220 generates a complementary signal DCLK1B of the first control clock signal DCLK1 by inverting the first control clock signal DCLK1. The complementary signal DCLK1B has a phase opposite to the phase of the first control clock signal DCLK1, in other words, the logic level of the complementary signal DCLK1B is opposite to the logic level of the first control clock signal DCLK1 at the same point in time. The control signal generation circuit 220 generates the second control clock signal DCLK2 with a pulse width that surrounds the pulse width of the first control clock signal DCLK1. A first pulse width of a first signal that surrounds a second pulse width of a second signal indicates that the first pulse width begins earlier in time than the second pulse width begins and the first pulse width ends later in time than the second pulse width ends. Accordingly, as the pulse width of the first control clock signal DCLK1 increases, the pulse width of the second control clock signal DCLK2 increases. As the pulse width of the first control clock signal DCLK1 decreases, the pulse width of the second control clock signal DCLK2 decreases. The control signal generation circuit 220 generates a complementary signal DCLK2B of the second control clock signal DCLK2 by inverting the second control clock signal DCLK2. The complementary signal DCLK2B has a phase opposite to the phase of the second control clock signal DCLK2, in other words, the logic level of the complementary signal DCLK2B is opposite to the logic level of the second control clock signal DCLK2 at the same point in time. The pulse width of the complementary signal DCLK2B surrounds the pulse width of the complementary signal DCLK1B.

The second driver 230 receives the first transmission signal OUT1 from the first driver 210. The first signal transmission line TL1 electrically couples the second driver 230 to the first driver 210. The second driver 230 receives the first transmission signal OUT1 from the first signal transmission line TL1. The second driver 230 receives the first control clock signal DCLK1 and the second control clock signal DCLK2 from the control signal generation circuit 220. The second driver 230 generates a second transmission signal OUT2 based on the first transmission signal OUT1, the first control clock signal DCLK1, and the second control clock signal DCLK2. The second driver 230 outputs the second transmission signal OUT2 on a second signal transmission line TL2. The second transmission signal OUT2 may be received by an additional circuit that is electrically coupled to the second driver 230 by the second signal transmission line TL2.

The second driver 230 generates a first driving control signal PUC and a second driving control signal PDC from the first transmission signal OUT1 based on the first control clock signal DCLK1 and the complementary signal DCLK1B. The second driver 230 generates the driving control signals PUC and PDC by sampling the first transmission signal OUT1 during an interval in which the first control clock signal DCLK1 is enabled. The second driver 230 samples the first transmission signal OUT1 for a sufficient time and generates the second transmission signal OUT2 at a logic level that corresponds to the logic level of the first transmission signal OUT1, although the pulse width of the clock signal CLKB and/or the delay clock signal CLKDB may be adjusted depending on process variation because the second driver 230 generates the driving control signals PUC and PDC in synchronization with the first control clock signal DCLK1. The second driver 230 outputs the first driving control signal PUC on a first node TN1 and outputs the second driving control signal PDC on a second node TN2. The second driver circuit 230 generates the second transmission signal OUT2 based on the voltage levels of nodes TN1 and TN2. The second driver 230 may pull-up the voltage level of the second transmission signal OUT2 based on the voltage level of the first node TN1 and may pull-down the voltage level of the second transmission signal OUT2 based on the voltage level of the second node TN2. The second driver 230 may precharge the nodes TN1 and TN2 based on the second control clock signal DCLK2 and the complementary signal DCLK2B. The second driver 230 floats the first and second nodes TN1 and TN2 during an interval in which the second control clock signal DCLK2 is enabled. Accordingly, the second driver 230 maintains the voltage levels of the driving control signals PUC and PDC during the interval in which the second control clock signal DCLK2 and the complementary signal DCLK2B are enabled. The second driver 230 may precharge the nodes TN1 and TN2 during an interval in which the second control clock signal DCLK2 is disabled. The second driver 230 floats the nodes TN1 and TN2 during the interval in which the second control clock signal DCLK2 is enabled to provide sufficient time for the second transmission signal OUT2 to be generated based on the driving control signals DCLK1 and DCLK2.

The first driver 210 includes a first pre-driving circuit 211 and a first main-driving circuit 212. The first pre-driving circuit 211 receives the input signal IN and the clock signal CLKB and generates a pull-up signal PU and a pull-down signal PD based on the input signal IN and the clock signal CLKB. When the clock signal CLKB is enabled, for example, at a low logic level, the first pre-driving circuit 211 enables one of the pull-up signal PU and the pull-down signal PD based on the logic level of the input signal IN. When the clock signal CLKB is enabled and the input signal IN is at a high logic level, the first pre-driving circuit 211 enables the pull-up signal PU at a high logic level and disables the pull-down signal PD at a low logic level. When the clock signal CLKB is enabled and the input signal IN is at a low logic level, the first pre-driving circuit 211 enables the pull-down signal PD at a high logic level and disables the pull-up signal PU at a low logic level. When the clock signal CLKB is disabled at a high logic level, the first pre-driving circuit 211 disables both the pull-up signal PU and the pull-down signal PD.

The first main-driving circuit 212 receives the pull-up signal PU and the pull-down signal PD. The first main-driving circuit 212 generates the first transmission signal OUT1 based on the pull-up signal PU and the pull-down signal PD and drives the first transmission signal OUT1 on the first signal transmission line TL1. The first main-driving circuit 212 receives the first voltage VH and the second voltage VL. The second voltage VL is at a lower voltage level than voltage level of the first voltage VH. The first voltage VH is at a voltage level sufficiently high to be determined to be a high logic level. The second voltage VL is at a voltage level sufficiently low to be determined to be a low logic level. Based on the pull-up signal PU, the first main-driving circuit 212 generates the first transmission signal OUT1 at a high logic level by applying a current to pull-up the voltage level at the first signal transmission line TL1 to the voltage level of the first voltage VH. Based on the pull-down signal PD, the first main-driving circuit 212 generates the first transmission signal OUT1 at a low logic level by applying a current to pull-down the voltage level at the first signal transmission line TL1 to the voltage level of the second voltage VL. The first main-driving circuit 212 may reduce power consumption utilized to generate the first transmission signal OUT1 from the input signal IN and facilitate the propagation of a high frequency signal by reducing the swing width or range of values of the first transmission signal OUT1.

The first pre-driving circuit 211 includes a first inverter 211-1, a second inverter 211-2, a NAND gate 211-3, and a NOR gate 211-4. The first inverter 211-1 receives the clock signal CLKB and inverts the clock signal CLKB. The second inverter 211-2 receives the output signal of the first inverter 211-1 and inverts the output signal of the first inverter 211-1. The NAND gate 211-3 receives the input signal IN and the output signal of the first inverter 211-1 and generates the pull-up signal PU by applying NAND logic to the input signal IN and the output signal of the first inverter 211-1. The NOR gate 211-4 receives the input signal IN and the output signal of the second inverter 211-2 and generates the pull-down signal PD by applying NOR logic to the input signal IN and the output signal of the second inverter 211-2.

The first main-driving circuit 212 includes a third inverter 212-1, a first transistor 212-2, and a second transistor 212-3. The third inverter 212-1 receives the pull-up signal PU and inverts the pull-up signal PU. Each of the transistors 212-2 and 212-3 is an N channel MOS transistor in this example. The gate of the first transistor 212-2 receives the output signal of the third inverter 212-1. The source of the first transistor 212-2 receives the first voltage VH. The first transistor 212-2 includes a drain electrically coupled to the first signal transmission line TL1. The first transmission signal OUT1 is output from the drain of the first transistor 212-2 when the pull-up signal PU is enabled. The gate of the second transistor 212-3 receives the pull-down signal PD. The source of the second transistor 212-3 receives the second voltage VL. The second transistor 212-3 includes a drain electrically coupled to the first signal transmission line TL1. The first transmission signal OUT1 is output from the drain of the second transistor 212-3 when the pull-down signal PD is enabled. The first transistor 212-2 reduces the voltage level of the first signal transmission line TL1 to a reduced voltage level by reducing the voltage level of the first voltage VH by a voltage corresponding to the threshold voltage of the first transistor 212-2. Accordingly, the swing width or range of values of the first transmission signal OUT1 may be reduced.

The second driver 230 includes a second pre-driving circuit 231 and a second main-driving circuit 233. The second pre-driving circuit 231 receives the first transmission signal OUT1 and the first control clock signal DCLK1 and the complementary signal DCLK1B. The second pre-driving circuit 231 generates the first driving control signal PUC and the second driving control signal PDC by sampling the first transmission signal OUT1 in synchronization with the first control clock signal DCLK1 and the complementary signal DCLK1B. The second pre-driving circuit 231 generates the first driving control signal PUC and the second driving control signal PDC based on the logic level of the first transmission signal OUT1 during the enable interval of the first control clock signal DCLK1 and the complementary signal DCLK1B. When the logic level of the first transmission signal OUT1 is a first logic level during the enable interval of the first control clock signal DCLK1, the second pre-driving circuit 231 generates the driving control signals PUC and PDC at a logic level, for example, a second logic level, opposite to the logic level of the first transmission signal OUT1. When the logic level of the first transmission signal OUT1 is the second logic level during the enable interval of the first control clock signal DCLK1 and the complementary signal DCLK1B, the second pre-driving circuit 231 generates the driving control signals PUC and PDC at a logic level, such as the first logic level, opposite to the logic level of the first transmission signal OUT1. The first logic level may be a low logic level. The second logic level may be a high logic level. The second pre-driving circuit 231 outputs the first driving control signal PUC on the first node TN1 and outputs the second driving control signal PDC on the second node TN2.

The second pre-driving circuit 231 includes a first driving control circuit 241 and a second driving control circuit 242. The first driving control circuit 241 receives the first control clock signal DCLK1, the complementary signal DCLK1B, and the transmission signal OUT1. The first driving control circuit 241 generates the first driving control signal PUC by inverting the first transmission signal OUT1 during an interval in which the first control clock signal DCLK1 is enabled at a high logic level and the complementary signal DCLK1B is enabled at a low logic level in this example. When the first transmission signal OUT1 is at a low logic level, the first driving control circuit 241 generates the first driving control signal PUC at a high logic level and outputs the first driving control signal PUC on the first node TN1. When the first transmission signal OUT1 is at a high logic level, the first driving control circuit 241 generates the first driving control signal PUC at a low logic level and outputs the first driving control signal PUC on the first node TN1. The second driving control circuit 242 receives the first control clock signal DCLK1, the complementary signal DCLK1B, and the transmission signal OUT1. The second driving control circuit 242 generates the second driving control signal PDC by inverting the first transmission signal OUT1 during an interval in which the first control clock signal DCLK1 is enabled at a high logic level and the complementary signal DCLK1B is enabled at a low logic level in this example. When the first transmission signal OUT1 is at a low logic level, the second driving control circuit 242 generates the second driving control signal PDC at a high logic level and outputs the second driving control signal PDC on the second node TN2. When the first transmission signal OUT1 is at a high logic level, the second driving control circuit 242 generates the second driving control signal PDC at a low logic level and outputs the second driving control signal PDC on the second node TN2.

A first precharge circuit 251 is electrically coupled to the first node TN1 and receives the second control clock signal DCLK2, and a second precharge circuit 252 is electrically coupled to the second node TN2, and receives the complementary second control clock signal DCLK2B. The first precharge circuit 251 precharges the first node TN1 based on the second control clock signal DCLK2, and the second precharge circuit 252 precharges the second node TN2 based on the complementary second control clock signal DCLK2B. The precharge circuits 251 and 252 float the nodes TN1 and TN2 during an interval in which the second control clock signal DCLK2 and the complementary second control clock signal DCLK2B are enabled. The first precharge circuit 251 precharges the first node TN1 during the interval in which the second control clock signal DCLK2 is disabled, and the second precharge circuit 252 precharges the second node TN2 during the interval in which the complementary second control clock signal DCLK2B is disabled. The first precharge circuit 251 precharges the first node TN1 to the voltage level of the first voltage VH, and the second precharge circuit 252 precharges the second node TN2 to the voltage level of the second voltage VL. The first precharge circuit 251 receives the second control clock signal DCLK2 and provides the first voltage VH to the first node TN1 based on the second control clock signal DCLK2. The first precharge circuit 251 does not provide the first voltage VH to the first node TN1 when the second control clock signal DCLK1 is enabled at a high logic level and provides the first voltage VH to the first node TN1 when the second control clock signal DCLK2 is disabled at a low logic level in this example. The second precharge circuit 252 receives the complementary signal DCLK2B of the second control clock signal DCLK2 and provides the second voltage VL to the second node TN2 based on the complementary signal DCLK2B of the second control clock signal DCLK2. The second precharge circuit 252 does not provide the second voltage VL to the second node TN2 when the complementary signal DCLK2B is disabled at a low logic level and may provide the second voltage VL to the second node TN2 when the complementary signal DCLK2B of the second control clock signal DCLK2 is enabled at a high logic level in this example.

The first node TN1 and the second node TN2 electrically couple the second main-driving circuit 233 to the second pre-driving circuit 231. The main-driving circuit 233 receives the first driving control signal PUC from the first node TN1 and receives the second driving control signal PDC from the second node TN2. The second main-driving circuit 233 generates the second transmission signal OUT2 based on the driving control signals PUC and PDC and drives the second transmission signal OUT2 on the second signal transmission line TL2. Based on the voltage level of the first driving control signal PUC on the first node TN1, the second main-driving circuit 233 pull-up drives the second transmission signal OUT2. Based on the first driving control signal PUC, the second main-driving circuit 233 may generate the second transmission signal OUT2 at a high logic level by applying a current to pull-up the voltage level of the second signal transmission line TL2 to the voltage level of the first voltage VH. Based on the voltage level of the second driving control signal PDC on the second node TN2, the second main-driving circuit 233 pull-down drives the second transmission signal OUT2. Based on the second driving control signal PDC, the second main-driving circuit 233 may generate the second transmission signal OUT2 at a low logic level by applying a current to pull-down the voltage level at the second signal transmission line TL2 to the voltage level of the second voltage VL.

In an embodiment, the signal driving circuit 200 optionally includes a first latch 261 and a second latch 262. The first latch 261 is electrically coupled to the first node TN1 and latches the voltage level of the first node TN1. The second latch 262 is electrically coupled to the second node TN2 and latches the voltage level of the second node TN2. The latches 261 and 262 may have a weak current driving force, for example, to minimally maintain the voltage level of the nodes TN1 and TN2. For example, the current driving force of the first latch 261 may be smaller than the current driving force of the first driving control circuit 241 or the first precharge circuit 251. The current driving force of the second latch 262 may be smaller than the current driving force of the second driving control circuit 242 or the second precharge circuit 252.

The first driving control circuit 241 includes a first transistor 241-1, a second transistor 241-2, a third transistor 241-3, and a fourth transistor 241-4. The first transistor 241-1 and the second transistor 241-2 may each be a P channel MOS transistor. The third transistor 241-3 and the fourth transistor 241-4 may each be an N channel MOS transistor. The transistors 241-1, 241-2, 241-3, and 241-4 form a three-state inverter. The gate of the first transistor 241-1 receives the complementary signal DCLK1B of the first control clock signal DCLK1. The source of the first transistor 241-1 receives the first voltage VH. The gate of the second transistor 241-2 receives the first transmission signal OUT1. The source of the second transistor 241-2 is electrically coupled to the drain of the first transistor 241-1. The second transistor 241-2 includes a drain electrically coupled to the first node TN1. The gate of the third transistor 241-3 receives the first control clock signal DCLK1. The source of the third transistor 241-3 receives the second voltage VL. The gate of the fourth transistor 241-4 receives the first transmission signal OUT1. The fourth transistor 241-4 includes a drain electrically coupled to the first node TN1. The source of the fourth transistor 241-4 is electrically coupled to the drain of the third transistor 241-3.

The second driving control circuit 242 includes a fifth transistor 242-1, a sixth transistor 242-2, a seventh transistor 242-3, and an eighth transistor 242-4. The fifth transistor 242-1 and the sixth transistor 242-2 may each be a P channel MOS transistor. The seventh transistor 242-3 and the eighth transistor 242-4 may each be an N channel MOS transistor. The transistors 242-1, 242-2, 242-3, and 242-4 form a three-state inverter. The gate of the fifth transistor 242-1 receives the complementary signal DCLK1B of the first control clock signal DCLK1. The source of the fifth transistor 242-1 receives the first voltage VH. The gate of the sixth transistor 242-2 receives the first transmission signal OUT1. The source of the sixth transistor 242-2 is electrically coupled to the drain of the fifth transistor 242-1. The sixth transistor 242-2 includes a drain electrically coupled to the second node TN2. The gate of the seventh transistor 242-3 receives the first control clock signal DCLK1. The source of the seventh transistor 242-3 receives the second voltage VL. The gate of the eighth transistor 242-4 receives the first transmission signal OUT1. The eighth transistor 242-4 includes a drain electrically coupled to the second node TN2. The source of the eighth transistor 242-4 is electrically coupled to the drain of the seventh transistor 242-3.

The first precharge circuit 251 includes a first transistor 251-1. The second precharge circuit 252 includes a second transistor 252-1. The first transistor 251-1 is a P channel MOS transistor in this example. The second transistor 252-1 is an N channel MOS transistor in this example. The gate of the first transistor 251-1 receives the second control clock signal DCLK2. The source of the first transistor 251-1 receives the first voltage VH. The first transistor 251-1 includes a drain electrically coupled to the first node TN1. The first transistor 251-1 has a smaller current driving force than each of the transistors 241-1, 241-2, 241-3, and 241-4. The gate of the second transistor 252-1 receives the complementary signal DCLK2B of the second control clock signal DCLK2. The second transistor 252-1 includes a drain electrically coupled to the second node TN2. The source of the second transistor 252-1 receives the second voltage VL. The second transistor 252-1 has a smaller current driving force than each of the transistors 242-1, 242-2, 242-3, and 242-4.

The second main-driving circuit 233 includes an inverter 233-1, a first transistor 233-2, and a second transistor 233-3. The first transistor 233-2 and the second transistor 233-3 may each be an N channel MOS transistor. The input stage of the inverter 233-1 is electrically coupled to the first node TN1. The inverter 233-1 inverts the first driving control signal PUC on the first node TN1. The gate of the first transistor 233-2 is electrically coupled to the output stage of the inverter 233-1 and receives the output signal of the inverter 233-1. The drain of the first transistor 233-2 receives the first voltage VH. The source of the first transistor 233-2 is electrically coupled to the second signal transmission line TL2. The gate of the second transistor 233-3 is electrically coupled to the second node TN2 and receives the second driving control signal PDC on the second node TN2. The second transistor 233-3 includes a drain electrically coupled to the second signal transmission line TL2. The source of the second transistor 233-3 receives the second voltage VL. The second transmission signal OUT2 is output to the second signal transmission line TL2 by one of the source of the first transistor 233-2 and the drain of the second transistor 233-3.

Figure 4:
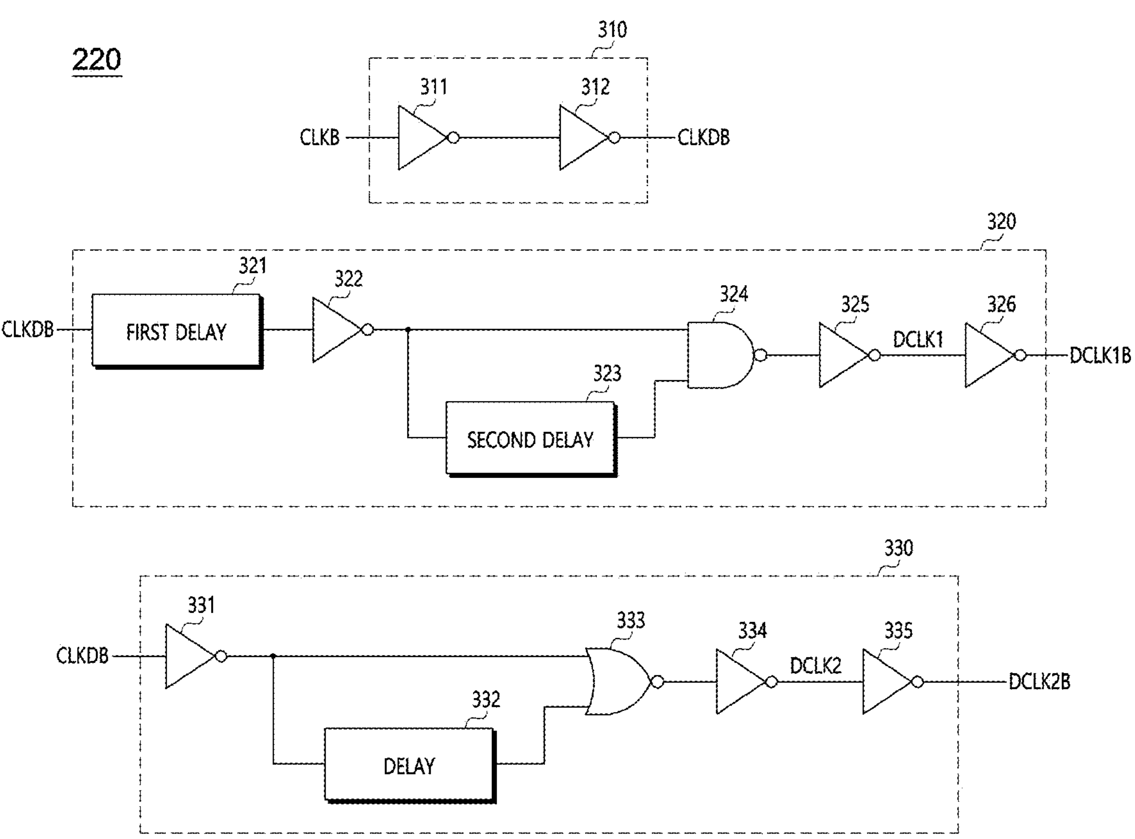
FIG. 4 is a diagram illustrating a configuration of a control signal generation circuit according to an embodiment.

FIG. 4 is a diagram illustrating a configuration of the control signal generation circuit 220, for example, as illustrated in FIG. 3. Referring to FIG. 4, the control signal generation circuit 220 includes a base delay 310, a first clock generation circuit 320, and a second clock generation circuit 330. The base delay 310 is a circuit that receives the clock signal CLKB and generates the delay clock signal CLKDB by delaying the clock signal CLKB. The delay of the base delay 310 may correspond to a time period for the propagation delay of the first signal transmission line TL1 and may correspond to the time period for the first transmission signal OUT1 to be transmitted from the first driver 210 to the second driver 230 on the first signal transmission line TL1. The base delay 310 includes a first inverter 311 and a second inverter 312. The first inverter 311 receives the clock signal CLKB and inverts the clock signal CLKB. The second inverter 312 receives the output signal of the first inverter 311 and generates the delay clock signal CLKDB by inverting the output signal of the first inverter 311.

The first clock generation circuit 320 receives the delay clock signal CLKDB and generates the first control clock signal DCLK1 and the complementary signal DCLK1B of the first control clock signal DCLK1 based on the delay clock signal CLKDB. The first clock generation circuit 320 includes a pulse generator that delays the delay clock signal CLKDB and combines the result with at least the delay clock signal CLKDB to generate the first control clock signal DCLK1 with an adjustable pulse width different from the pulse width of the delay clock signal CLKDB. The first clock generation circuit 320 include a first delay 321, a first inverter 322, a second delay 323, a NAND gate 324, a second inverter 325, and a third inverter 326. The first delay 321 receives the delay clock signal CLKDB and delays the delay clock signal CLKDB. The delay time period of the first delay 321 is a first time period and may be a very short delay time period. The short delay time may be minimum delay time that allows the first control clock signal DCLK1 to be enabled later than the complementary signal DCLK1B of the first control clock signal. The first inverter 322 receives the output signal of the first delay 321 and inverts the output signal of the first delay 321. The second delay 323 receives the output signal of the first inverter 322 and delays the output signal of the first inverter 322. In an embodiment, the delay time period of the second delay 323 is longer than the delay time period of the first delay 321. The delay time period of the second delay 323 may be varied to adjust the pulse width of the first control clock signal DCLK1. The NAND gate 324 receives the output signal of the first inverter 322 and the output signal of the second delay 323. The NAND gate 324 applies NAND logic to the output signal of the first inverter 322 and the output signal of the second delay 323. The second inverter 325 receives the output signal of the NAND gate 324 and generates the first control clock signal DCLK1 by inverting the output signal of the NAND gate 324. The third inverter 326 receives the first control clock signal DCLK1 and generates the complementary signal DCLK1B of the first control clock signal by inverting the first control clock signal DCLK1.

The second clock generation circuit 330 receives the delay clock signal CLKDB and generates the second control clock signal DCLK2 and the complementary signal DCLK2B of the second control clock signal DCLK2 based on the delay clock signal CLKDB. The second clock generation circuit 330 includes a pulse generator that generates the second control clock signal DCLK2 and adjusts the pulse width of the second control clock signal DCLK2 based on the delay clock signal CLKDB. The second clock generation circuit 330 include a first inverter 331, a delay 332, a NOR gate 333, a second inverter 334, and a third inverter 335. In an embodiment, the second clock generation circuit 330 does not include the first delay 321 such that the second control clock signal DCLK2 is generated having a pulse width that surrounds the pulse width of the first control clock signal DCLK1. The first inverter 331 receives the delay clock signal CLKDB and inverts the delay clock signal CLKDB. The delay 332 receives the output signal of the first inverter 331 and delays the output signal of the first inverter 331. The delay time period of the delay 332 is substantially the same as the delay time period of the second delay 323. In an embodiment, the delay time period of the delay 332 is different from the delay time period of the second delay 323. The delay time period of the delay 332 may be varied to adjust the pulse width of the second control clock signal DCLK2. The NOR gate 333 receives the output signal of the first inverter 331 and the output signal of the delay 332. The NOR gate 333 applies NOR logic to the output signal of the first inverter 331 and the output signal of the delay 332. The second inverter 334 receives the output signal of the NOR gate 333 and generates the second control clock signal DCLK2 by inverting the output signal of the NOR gate 333. The third inverter 325 receives the output signal, DCLK2, of the second inverter 324 and generates the complementary signal DCLK2B of the second control clock signal DCLK2 by inverting the output signal of the second inverter 324.

Figures 5A, 5B:
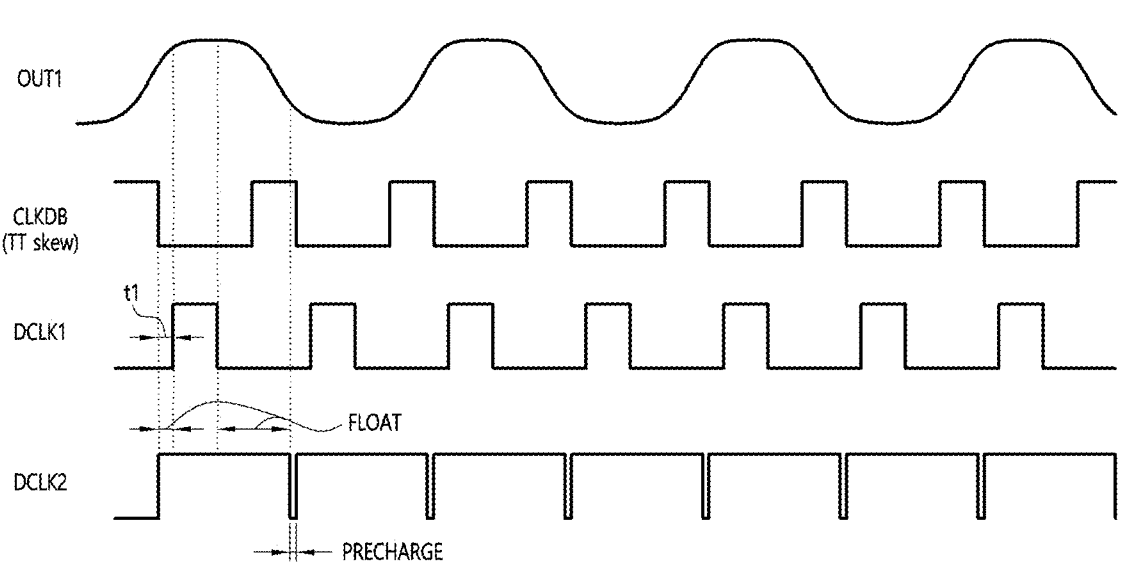
FIG. 5A to FIG. 5C are timing diagrams during operation of a signal driving circuit according to an embodiment.
Figure 5C:
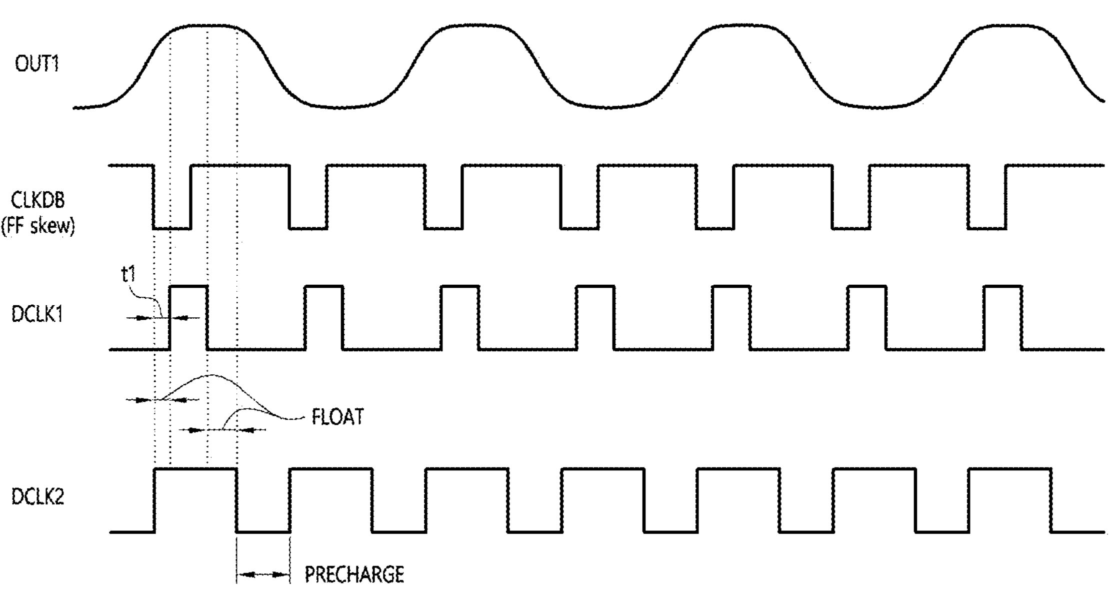

FIG. 5A to FIG. 5C are timing diagrams during operation of the signal driving circuit 200 according to an embodiment. FIG. 5A illustrates operation of the signal driving circuit 200 when the process skew of transistors is Typical/Typical or TT skew. FIG. 5B illustrates operation of the signal driving circuit 200 when the process skew of transistors is Slow/Slow or SS skew. FIG. 5C illustrates operation of the signal driving circuit 200 when the process skew of transistors is Fast/Fast or FF skew. Operation of the signal driving circuit 200 according to an embodiment is described with reference to FIG. 3 and FIG. 5A, FIG. 5B, and FIG. 5C. The first transmission signal OUT1 generated by the first driver 210 may be a pseudo-random binary sequence (PRBS) signal, although the first transmission signal OUT1 is alternates between a high logic level and a low logic level in the examples of FIG. 5A, FIG. 5B, and FIG. 5C.

As illustrated in FIG. 5A, when process skew of transistors is TT skew, the delay clock signal CLKDB has a pulse width corresponding to a reference pulse width. The first clock generation circuit 320 generates the first control clock signal DCLK1 that is enabled later than the delay clock signal CLKDB is enabled by a first time t1 and that has a narrower pulse width than the delay clock signal CLKDB. The second clock generation circuit 330 generates the second control clock signal DCLK2 having a pulse width that surrounds the pulse width of the first control clock signal DCLK1. A first pulse width of a first signal that surrounds a second pulse width of a second signal indicates that the first pulse width begins earlier in time than the second pulse width begins and the first pulse width ends later in time than the second pulse width ends. When the second control clock signal DCLK2 is disabled at a low logic level in this example, the precharge circuits 251 and 252 are activated, the first node TN1 is precharged to the voltage level of the first voltage VH, and the second node TN2 is precharged to the voltage level of the second voltage VL. When the second control clock signal DCLK2 is enabled at a high logic level in this example, the precharge circuits 251 and 252 are deactivated, and the precharge circuits 251 and 252 float the nodes TN1 and TN2, respectively, while DCLK1 is disabled at a low logic level. After the first time t1, when the first control clock signal DCLK1 is enabled, the driving control circuits 241 and 242 generate the driving control signals PUC and PDC, respectively, by sampling the first transmission signal OUT1. When the first transmission signal OUT1 is at a high logic level, the driving control circuits 241 and 242 generate the driving control signals PUC and PDC at a low logic level by lowering the voltage level of the nodes TN1 and TN2, respectively, to the voltage level of the second voltage VL. The length of a time interval during which the driving control signals PUC and PDC are generated on the nodes TN1 and TN2, respectively, may be adjusted by adjusting the pulse width of the first control clock signal DCLK1. When the first driving control signal PUC is at a low logic level, the second main-driving circuit 233 generates the second transmission signal OUT2 at a high logic level by raising the voltage level on the second signal transmission line TL2 to the voltage level of the first voltage VH. When the first control clock signal DCLK1 is disabled, the driving control circuits 241 and 242 stop generation of the driving control signals PUC and PDC, respectively, and the first and second nodes TN1 and TN2 maintain a floating state. The logic level of the driving control signals PUC and PDC is maintained for a period of time because the second control clock signal DCLK2 is maintained in an enabled state although the first control clock signal DCLK1 is disabled. The length of a time interval during which the nodes TN1 and TN2 are floated at the logic level of the driving control signals PUC and PDC may be adjusted by adjusting the pulse width of the second control clock signal DCLK2. As a result, the second transmission signal OUT2 may be driven at a high logic level for a time sufficient for the second driver 230 to stably generate the second transmission signal OUT2 at a logic level corresponding to the logic level of the first transmission signal OUT1. When the second control clock signal DCLK2 is disabled, the precharge circuits 251 and 252 precharge the nodes TN1 and TN2, respectively. While the nodes TN1 and TN2 are precharged, the second main-driving circuit 233 is deactivated, and the second transmission signal OUT2 is in a high impedance (high-Z) state. When comparing FIG. 2A and FIG. 5A, the pulse width of the first control clock signal DCLK1 is narrower than the pulse width of the delay clock signal CLKDB, and nodes TN1 and TN2 are each maintained in the floating state during the pulse width of the second control clock signal DCLK2, thus sufficient the time is provided to sample the first transmission signal OUT1. When the process skew is TT skew, the signal driving circuit 200 generate the second transmission signal OUT2 having substantially the same quality as the quality of the signal driving circuit 100.

As illustrated in FIG. 5B, when process skew of transistors is SS skew, the delay clock signal CLKDB has a wider pulse width than the reference pulse width. The first clock generation circuit 320 generates the first control clock signal DCLK1 that is enabled later than the delay clock signal CLKDB by a first time t1 and that has a narrower pulse width than the delay clock signal CLKDB. The second clock generation circuit 330 generates the second control clock signal DCLK2 having a pulse width that surrounds the pulse width of the first control clock signal DCLK1. A first pulse width of a first signal that surrounds a second pulse width of a second signal indicates that the first pulse width begins earlier in time than the second pulse width begins and the first pulse width ends later in time than the second pulse width ends. When the pulse width of the delay clock signal CLKDB is excessively wide, the second control clock signal DCLK2 does not toggle and becomes a constant level signal at the voltage level of the first voltage VH. When the second control clock signal DCLK2 is in a disabled state, the precharge circuits 251 and 252 are activated, the first node TN1 is precharged to the voltage level of the first voltage VH, and the second node TN2 is precharged to the voltage level of the second voltage VL. When the second control clock signal DCLK2 is enabled, the precharge circuits 251 and 252 are deactivated, and the precharge circuits 251 and 252 float the nodes TN1 and TN2, respectively. When the second control clock signal DCLK2 is generated at a logic level, the precharge circuits 251 and 252 continuously float the nodes TN1 and TN2. After the first time t1, when the first control clock signal DCLK1 is enabled, the driving control circuits 251 and 252 generate the driving control signals PUC and PDC, respectively, by sampling the first transmission signal OUT1. When the first transmission signal OUT1 is at a high logic level, the driving control circuits 251 and 252 generate the driving control signals PUC and PDC at a low logic level by lowering the voltage level of the nodes TN1 and TN2, respectively, to the voltage level of the second voltage VL. When the first driving control signal PUC at a low logic level the second main-driving circuit 233 generates the second transmission signal OUT2 at a high logic level by raising the voltage level on the second signal transmission line TL2 to the voltage level of the first voltage VH. When the first control clock signal DCLK1 is disabled, the driving control circuits 241 and 242 no longer generate the driving control signals PUC and PDC. Although the first control clock signal DCLK1 is disabled, the nodes TN1 and TN2 continuously maintain the floating state, and the logic level of the driving control signals PUC and PDC is maintained for a period of time. As a result, the second transmission signal OUT2 may be driven at a high logic level for a time sufficient for the second driver 230 to stably generate the second transmission signal OUT2 at a logic level corresponding to the logic level of the first transmission signal OUT1. When comparing FIG. 2B and FIG. 5B, the pulse width of the first control clock signal DCLK1 is narrower than the pulse width of the delay clock signal CLKDB. The signal driving circuit 200 improves the hold margin that is sufficient to accurately or reliably generate the second transmission signal OUT2. When the process skew is SS skew, the signal driving circuit 200 generates the second transmission signal OUT2 having improved quality, for example, compared to the signal driving circuit 100.

As illustrated in FIG. 5C, when the process skew of transistors is FF skew, the delay clock signal CLKDB has a pulse width narrower than the reference pulse width. The first clock generation circuit 320 generates the first control clock signal DCLK1 that is enabled later than the delay clock signal CLKDB is enabled by a first time t1 and that has a wider pulse width than the delay clock signal CLKDB. The second clock generation circuit 330 generates the second control clock signal DCLK2 having a pulse width that surrounds the pulse width of the first control clock signal DCLK1. A first pulse width of a first signal that surrounds a second pulse width of a second signal indicates that the first pulse width begins earlier in time than the second pulse width begins and the first pulse width ends later in time than the second pulse width ends. When the second control clock signal DCLK2 is disabled at a low logic level in this example, the precharge circuits 251 and 252 are activated, the first node TN1 is precharged to the voltage level of the first voltage VH, and the second node TN2 is precharged to the voltage level of the second voltage VL. When the second control clock signal DCLK2 is enabled at a high logic level in this example, the precharge circuits 251 and 252 are deactivated, and the precharge circuits 251 and 252 float the nodes TN1 and TN2, respectively while DCLK1 is disabled at a low logic level. After the first time t1, when the first control clock signal DCLK1 is enabled, the driving control circuits 251 and 252 generate the driving control signals PUC and PDC, respectively, by sampling the first transmission signal OUT1. When the first transmission signal OUT1 is at a high logic level, the driving control circuits 251 and 252 generate the driving control signals PUC and PDC at a low logic level by lowering the voltage level of the nodes TN1 and TN2, respectively, to the voltage level of the second voltage VL. When the first driving control signal PUC is at a low logic level, the second main-driving circuit 233 generates the second transmission signal OUT2 at a high logic level by raising the voltage level on the second transmission signal OUT2 to the voltage level of the first voltage VH. When the first control clock signal DCLK1 is disabled, the driving control circuits 241 and 242 no longer generate the driving control signals PUC and PDC, and the first and second nodes TN1 and TN2 maintain the floating state. The logic level of the driving control signals PUC and PDC is maintained for a period of time because the second control clock signal DCLK2 is maintained in an enabled state although the first control clock signal DCLK1 is disabled. As a result, the second transmission signal OUT2 may be driven at a high logic level for a time sufficient for the second driver 230 to stably generate the second transmission signal OUT2 at a logic level corresponding to the logic level of the first transmission signal OUT1. When the second control clock signal DCLK2 is disabled, the precharge circuits 251 and 252 precharge the nodes TN1 and TN2, respectively. While the nodes TN1 and TN2 are precharged, the second main-driving circuit 233 is deactivated, and the second transmission signal OUT2 is in a high impedance (high-Z) state. When comparing FIG. 2C and FIG. 5C, the first control clock signal DCLK1 is enabled at a later time than the delay clock signal CLKDB is enabled, and the pulse width of the first control clock signal DCLK1 is wider than the pulse width of the delay clock signal CLKDB. The signal driving circuit 200 provides a sufficient time to sample the first transmission signal OUT1. When the process skew is FF skew, the signal driving circuit 200 may generate the second transmission signal OUT2 having improved quality, for example, compared to the signal driving circuit 100.

FIG. 6 is a diagram illustrating a configuration of a semiconductor device 400 according to an embodiment. Referring to FIG. 6, the semiconductor device 400 includes a signal driving circuit 410 and a receiver 420. The signal driving circuit 410 includes a first driver 411, a second driver 412, a third driver 413, and a control signal generation circuit 414. The first driver 411 receives the input signal IN and the clock signal CLKB. The first driver 411 generates the first transmission signal OUT1 from the input signal IN in synchronization with the clock signal CLKB. The first driver 411 outputs the first transmission signal OUT1 on the first signal transmission line TL1. The first driver 411 may have a substantially similar configuration to the first driver 210 illustrated in FIG. 3. The first signal transmission line TL1 electrically couples the second driver 412 to the first driver 411, and the second driver 412 receives the first transmission signal OUT1 from the first driver 411 on the first signal transmission line TL1. The second driver 412 receives the first control clock signal DCLK1 and the second control clock signal DCLK2. The second driver 412 generates the second transmission signal OUT2 from the first transmission signal OUT1 in synchronization with the first control clock signal DCLK1 and the second control clock signal DCLK2. The second driver 412 outputs the second transmission signal OUT2 on the second signal transmission line TL2. The second driver 412 may have a substantially similar configuration to the second driver 230 illustrated in FIG. 3. The second signal transmission line TL2 electrically couples the third driver 413 to the second driver 412, and the third driver 413 receives the second transmission signal OUT2 from the second driver 412 on the second signal transmission line TL2. The third driver 413 receives a third control clock signal DCLK3 and a fourth control clock signal DCLK4. The third driver 413 generates a third transmission signal OUT3 from the second transmission signal OUT2 in synchronization with the third control clock signal DCLK3 and the fourth control clock signal DCLK4. The third driver 413 outputs the third transmission signal OUT3 on a third signal transmission line TL3. The third driver 413 may have a substantially similar configuration to the second driver 230 illustrated in FIG. 3, except that the input signals and the output signals are different.

The control signal generation circuit 414 receives the clock signal CLKB and generates the first control clock signal DCLK1, the second control clock signal DCLK2, the third control clock signal DCLK3, and the fourth control clock signal DCLK4. The control signal generation circuit 414 generates a delay clock signal by delaying the clock signal CLKB by a time period corresponding to the propagation delay of the first signal transmission line TL1 and generates the control clock signals DCLK1 and DCLK2 based on the delay clock signal. The control signal generation circuit 414 may adjust the pulse width of the first control clock signal DCLK1 based on process variation and/or the pulse width of the delay clock signal. The control signal generation circuit 414 generates the second control clock signal DCLK2 having a pulse width that surrounds the pulse width of the first control clock signal DCLK1. The control signal generation circuit 414 may include substantially similar components as the control signal generation circuit 220 illustrated in FIG. 3 and FIG. 4. The control signal generation circuit 414 include additional components to generate the third control clock signal DCLK3 and the fourth control clock signal DCLK4. The control signal generation circuit 414 generates the control clock signals DCLK3 and DCLK4 by delaying the control clock signals DCLK1 and DCLK2 by a time period corresponding to the propagation delay of the second signal transmission line TL2. The control signal generation circuit 414 additionally includes a delay circuit that generates the control clock signals DCLK3 and DCLK4 by delaying the control clock signals DCLK1 and DCLK2, respectively.

The third signal transmission line TL3 electrically couples the receiver 420 to the third driver 413, and the receiver 420 receives the third transmission signal OUT3 from the third driver 413 on the third signal transmission line TL3. The receiver 420 may be a circuit configured to receive signals such as the third transmission signal OUT3. The signal driving circuit 410 can stably generate the transmission signals OUT2 and OUT3 at a logic level corresponding to the logic level of the input signal IN regardless of process variation. Accordingly, a malfunction or errors within the receiver 420 may be reduced, and operation reliability of the semiconductor device 400 can be improved.

Although the detailed embodiments of the present disclosure are described in the present disclosure, those skilled in the art will understand that various modifications, additions, and substitutions related to these embodiments are possible without departing from the scope and technical concepts of the present disclosure. Therefore, the scope of the present disclosure should not be limited to the foregoing embodiments. All changes within the meaning and range of equivalency of the claims are included within their scope.

What is claimed is:

1. A signal driving circuit comprising:

a first driver configured to generate a first transmission signal based on a clock signal and an input signal;

a control signal generation circuit configured to generate a delay clock signal by delaying the clock signal, to generate a first control clock signal including a different pulse width than a pulse width of the delay clock signal and to generate a second control clock signal having a pulse width that surrounds a pulse width of the first control clock signal; and a second driver configured to float a first node and a second node based on the second control clock signal, to output a first driving control signal to the first node and a second driving control signal to the second node based on the first control clock signal and the first transmission signal, and to generate a second transmission signal based on a voltage level of the first node and a voltage level of the second node.

2. The signal driving circuit of claim 1, wherein the second driver is configured to precharge the first node and the second node when the second control clock signal is disabled.

3. The signal driving circuit of claim 1, wherein the first driver comprises:

a first pre-driving circuit configured to generate a pull-up signal and a pull-down signal based on the clock signal and the input signal; and a first main-driving circuit configured to pull-up drive the first transmission signal based on the pull-up signal and pull-down drive the first transmission signal based on the pull-down signal.

4. The signal driving circuit of claim 3, wherein the first main-driving circuit comprises:

a first N channel MOS transistor configured to drive the first transmission signal to a first voltage in response to receiving the pull-up signal; and a second N channel MOS transistor configured to drive the first transmission signal to a second voltage at a lower voltage level than the first voltage in response to receiving the pull-down signal.

5. The signal driving circuit of claim 1, wherein the control signal generation circuit is configured to generate the first control clock signal with a narrower pulse width than the pulse width of the clock signal when a pulse width of the clock signal is a reference pulse width and to generate the first control clock signal with a wider pulse width than the pulse width of the clock signal when the pulse width of the clock signal is narrower than the reference pulse width.

6. The signal driving circuit of claim 1, wherein the control signal generation circuit comprises:

a base delay configured to generate the delay clock signal by delaying the clock signal;

a first clock generation circuit configured to generate, based on the delay clock signal, the first control clock signal including a different pulse width than the pulse width of the delay clock signal; and a second clock generation circuit configured to generate the second control clock signal having the pulse width that surrounds the pulse width of the first control clock signal based on the delay clock signal.

7. The signal driving circuit of claim 6, wherein the first clock generation circuit comprises:

a first delay configured to delay the delay clock signal;

a first inverter configured to invert an output signal of the first delay;

a second delay configured to delay an output signal of the first inverter;

a NAND gate configured to apply NAND logic to the output signal of the first inverter and the output signal of the second delay; and a second inverter configured to generate the first control clock signal by inverting an output signal of the NAND gate.

8. The signal driving circuit of claim 7, wherein the pulse width of the first control clock signal is based on a delay time period of the second delay.

9. The signal driving circuit of claim 6, wherein the second clock generation circuit comprises:

a first inverter configured to invert the delay clock signal;

a delay configured to delay an output signal of the first inverter;

a NOR gate configured to apply NOR logic to the output signal of the first inverter and an output signal of the delay; and a second inverter configured to generate the second control clock signal by inverting an output signal of the NOR gate.

10. The signal driving circuit of claim 9, wherein the pulse width of the second control clock signal is based on a delay time period of the delay.

11. The signal driving circuit of claim 1, wherein the second driver comprises:

a second pre-driving circuit configured to generate the first driving control signal and the second driving control signal by sampling the first transmission signal in synchronization with the first control clock signal and output the first driving control signal to the first node and the second driving control signal to the second node; and a first precharge circuit configured to precharge the first node in synchronization with the second control clock signal;

a second precharge circuit configured to precharge the second node in synchronization with the second control clock signal; and a second main-driving circuit configured to pull-up drive the second transmission signal based on the voltage level of the first node and pull-down drive the second transmission signal based on the voltage level of the second node.

12. The signal driving circuit of claim 11, wherein the second pre-driving circuit comprises:

a first driving control circuit configured to generate the first driving control signal at a logic level opposite to a logic level of the first transmission signal when the first control clock signal is enabled; and a second driving control circuit configured to generate the second driving control signal at a logic level opposite to a logic level of the first transmission signal when the first control clock signal is enabled.

13. The signal driving circuit of claim 11:

wherein the first precharge circuit is configured to float the first node when the second control clock signal is enabled, and the second precharge circuit is configured to float the second node when the second control clock signal is enabled;

wherein the first precharge circuit is configured to precharge the first driving control signal to a high logic level when the second control clock signal is disabled; and wherein the second precharge circuit is configured to precharge the second driving control signal to a low logic level.

14. The signal driving circuit of claim 11, wherein:

the first precharge circuit is configured to apply a first voltage to the first node based on the second control clock signal; and the second precharge circuit configured to apply a second voltage to the second node based on the second control clock signal, wherein the second voltage is at a lower voltage level than the first voltage.

15. The signal driving circuit of claim 11, wherein the second main-driving circuit comprises:

an inverter configured to invert a signal on the first node;

a first N channel MOS transistor configured to drive the second transmission signal to a first voltage in response to receiving an output signal from the inverter; and a second N channel MOS transistor configured to drive the second transmission signal to a second voltage at a lower voltage level than the first voltage in response to receiving a signal on the second node.

16. The signal driving circuit of claim 1, wherein the second driver further comprises:

a first latch configured to maintain the voltage level of the first node; and a second latch configured to maintain the voltage level of the second node.

17. A signal driving circuit comprising:

a first driver configured to generate a first transmission signal based on a clock signal and an input signal;

a control signal generation circuit configured to generate a delay clock signal by delaying the clock signal, to generate a first control clock signal having a narrower pulse width than the delay clock signal when a process variation is one of a first skew corner and a second skew corner, to generate the first control clock signal having a wider pulse width than the delay clock signal when the process variation is a third skew corner, and to generate a second control clock signal having a pulse width that surrounds the pulse width of the first control clock signal; and a second driver configured to generate a first driving control signal and a second driving control signal based on the first transmission signal during an interval in which the first control clock signal is enabled, configured to generate a second transmission signal based on the first driving control signal and the second driving control signal, and configured to maintain a voltage level of the first driving control signal and a voltage level of the second driving control signal during an interval in which the second control clock signal is enabled.

18. The signal driving circuit of claim 17, wherein the control signal generation circuit is configured to generate the first control clock signal with a narrower pulse width than the pulse width of the delay clock signal when the pulse width of the delay clock signal is equal to a reference pulse width, and to generate the first control clock signal with a wider pulse width than the pulse width of the delay clock signal when the pulse width of the delay clock signal is narrower than the reference pulse width.

19. The signal driving circuit of claim 17, wherein the second driver comprises:

a second pre-driving circuit configured to generate the first driving control signal and the second driving control signal by sampling the first transmission signal in synchronization with the first control clock signal and output the first driving control signal to a first node and the second driving control signal to a second node;

a first precharge circuit configured to precharge the first node in synchronization with the second control clock signal and a second precharge circuit configured to precharge the second node in synchronization with the second control clock signal; and a second main-driving circuit configured to pull-up drive the second transmission signal based on a voltage level of the first node and pull-down drive the second transmission signal based on a voltage level of the second node.

20. The signal driving circuit of claim 19, wherein the first precharge circuit is configured to float the first node during a time interval in which the second control clock signal is enabled, and the second precharge circuit is configured to float the second node during a time interval in which the second control clock signal is enabled.

21. The signal driving circuit of claim 19, wherein the second main-driving circuit comprises:

an inverter configured to invert a signal on a first node;

a first N channel MOS transistor configured to drive the second transmission signal to a first voltage in response to receiving an output signal from the inverter; and a second N channel MOS transistor configured to drive the second transmission signal to a second voltage at a lower voltage level than the first voltage in response to receiving a signal on a second node.

22. The signal driving circuit of claim 17, further comprising:

a first latch configured to maintain a voltage level of a first node; and a second latch configured to maintain a voltage level of a second node.

23. A method comprising:

generating a first transmission signal based on a clock signal and an input signal;

generating a delay clock signal by delaying the clock signal;

generating a first control clock signal with a pulse width different than a pulse width of the delay clock signal;

generating a second control clock signal having a pulse width beginning before and ending later than a pulse width of the first control clock signal;

floating a first node and a second node based on the second control clock signal;

outputting a first driving control signal to the first node and a second driving control signal to the second node based on the first control clock signal and the first transmission signal; and generating a second transmission signal based on a voltage level of the first node and a voltage level of the second node.

* * * * *